United States Patent
Ye

(10) Patent No.: US 11,664,648 B2
(45) Date of Patent: *May 30, 2023

(54) PROGRAMMABLE OVERCURRENT PROTECTION FOR A SWITCH

(71) Applicant: Silanna Asia Pte Ltd, Singapore (SG)

(72) Inventor: Guanghua Ye, Guangdong (CN)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/804,930

(22) Filed: Jun. 1, 2022

(65) Prior Publication Data

US 2022/0294205 A1 Sep. 15, 2022

Related U.S. Application Data

(63) Continuation of application No. 17/249,377, filed on Mar. 1, 2021, now Pat. No. 11,374,392, which is a continuation of application No. 16/148,050, filed on Oct. 1, 2018, now Pat. No. 10,938,199.

(60) Provisional application No. 62/656,700, filed on Apr. 12, 2018.

(51) Int. Cl.
| | | |
|---|---|---|
| *H02H 3/05* | (2006.01) | |
| *H02H 1/00* | (2006.01) | |
| *H02H 3/08* | (2006.01) | |
| *H03K 17/082* | (2006.01) | |
| *H03F 3/45* | (2006.01) | |

(52) U.S. Cl.
CPC ............ *H02H 3/05* (2013.01); *H02H 1/0007* (2013.01); *H02H 3/08* (2013.01); *H03K 17/0822* (2013.01); *H03F 3/45475* (2013.01); *H03F 2200/129* (2013.01); *H03F 2203/45116* (2013.01)

(58) Field of Classification Search
CPC .......... H02H 3/05; H02H 1/0007; H02H 3/08; H03K 17/0822; H03F 3/45475; H03F 2200/129; H03F 2203/45116
See application file for complete search history.

(56) References Cited

U.S. PATENT DOCUMENTS

| | | |
|---|---|---|
| 5,519,341 A | 5/1996 | Corsi et al. |
| 5,841,313 A | 11/1998 | Levin et al. |
| 5,986,902 A | 11/1999 | Brkovic et al. |
| | (Continued) | |

FOREIGN PATENT DOCUMENTS

| | | |
|---|---|---|
| EP | 0966086 A2 | 12/1999 |
| JP | 2004248452 A | 9/2004 |
| | (Continued) | |

OTHER PUBLICATIONS

International Search Report dated Aug. 1, 2019 for PCT Patent Application No. PCT/IB2019/052354.
(Continued)

*Primary Examiner* — Adolf D Berhane
(74) *Attorney, Agent, or Firm* — MLO, a professional corp.

(57) ABSTRACT

Embodiments of the disclosure include a switch having an on-state resistance that varies based on a temperature coefficient of the switch and an overcurrent protection circuit coupled to the switch and having an adjustable overcurrent threshold level determined based on an adjustable voltage generated by the overcurrent protection circuit, the adjustable voltage generated based on the temperature coefficient of the switch.

19 Claims, 4 Drawing Sheets

(56) References Cited

U.S. PATENT DOCUMENTS

| | | |
|---|---|---|
| 10,938,199 B2 | 3/2021 | Ye |
| 11,374,392 B2 * | 6/2022 | Ye .......................... H02M 1/32 |
| 2002/0005749 A1 | 1/2002 | Descombes |
| 2003/0111984 A1 | 6/2003 | Isham |
| 2010/0214709 A1 | 8/2010 | Hall et al. |
| 2011/0109373 A1 | 5/2011 | Chen et al. |
| 2013/0250627 A1 | 9/2013 | Herfurth |
| 2013/0308356 A1 | 11/2013 | Subramanium et al. |
| 2015/0022120 A1 | 1/2015 | Ko |
| 2018/0097515 A1 | 4/2018 | Norling et al. |

FOREIGN PATENT DOCUMENTS

| | | |
|---|---|---|
| TW | 200301611 A | 7/2003 |
| TW | 201044791 A | 12/2010 |
| WO | 2005038952 A2 | 4/2005 |

OTHER PUBLICATIONS

Notice of Allowance and Fees dated Mar. 4, 2022 for U.S. Appl. No. 17/249,377.
Office Action dated Jul. 21, 2020 for U.S. Appl. No. 16/148,050.
Office Action dated Nov. 30, 2021 for U.S. Appl. No. 17/249,377.
Office Action dated Nov. 4, 2022 for Taiwan, Province of China Patent Application No. 108110508.

* cited by examiner

PROGRAMMABLE OVERCURRENT PROTECTION FOR A SWITCH

RELATED APPLICATIONS

This application is a continuation of U.S. patent application Ser. No. 17/249,377, filed Mar. 1, 2021, which claims priority to U.S. Pat. No. 10,938,199, issued Mar. 2, 2021, which claims priority to U.S. Provisional Patent Application No. 62/656,700, filed Apr. 12, 2018, all of which are hereby incorporated by reference in their entirety.

BACKGROUND

A synchronous switch mode power supply, such as a buck converter, is an electronic power supply that efficiently converts power from a first power regime to a second power regime. Such converters typically incorporate a high-side switch (e.g., a "control" switch), a low-side switch (e.g., a "synchronous" switch), and an inductor. The inductor couples a common node (e.g., a "phase node") of the switches to a load of the converter. In some applications, the switches are field-effect transistors (FETs). The high-side switch delivers power to the load through the inductor, thereby converting an input voltage at a first level to an output voltage at a second level. In synchronous buck DC-DC applications, when an output short condition occurs, current through the inductor increases to maintain the output voltage level at the inductor. However, this approach may cause the inductor to undesirably saturate, which may damage the FET.

SUMMARY

In some embodiments, an overcurrent protection circuit is coupled to a switch having an on-state resistance that varies based on a temperature coefficient of the switch. The overcurrent protection circuit has an adjustable overcurrent threshold level determined based on an adjustable voltage generated by the overcurrent protection circuit. The adjustable voltage is generated based on the temperature coefficient of the switch.

In some embodiments, a method for overcurrent protection involves generating, in an overcurrent protection circuit coupled to a switch, an adjustable voltage based on a temperature coefficient of the switch, the generated adjustable voltage having a positive temperature coefficient. The method further involves determining an overcurrent threshold level in the overcurrent protection circuit based on the generated adjustable voltage.

DETAILED DESCRIPTION

Improved methods and circuits are described herein for a programmable overcurrent protection circuit for one or more switches, such as switches used in a switch-mode power supply (SMPS) circuit having an inductor and one or more field-effect transistor (FET) switches, such as a metal-oxide-semiconductor field-effect transistor (MOSFET). When an output short condition occurs at a load of the SMPS circuit, an overcurrent event may occur. An overcurrent event may cause current through the inductor to increase so to maintain the output voltage. Such an overcurrent event may damage one or more of the FETs of the SMPS circuit.

Some overcurrent protection circuits sense a source-drain current level through a FET of the SMPS circuit and compare the sensed current level to an overcurrent threshold. If the sensed current level surpasses the current threshold, one or more FETs of the SMPS circuit are turned off to stop current flow through that FET switch to the load of the SMPS circuit.

Current flow through a FET switch is in part related to an on-resistance (Rdson) of a conduction channel formed between a drain region and a source region of that FET. However, the FET on-resistance varies according to a temperature coefficient of resistance (TCR) of the FET as a temperature of the FET varies. As such, at lower temperatures, a sensed source-drain current level through the FET of the SMPS circuit is the same or similar to a current level through the load of the SMPS circuit. However, at higher temperature levels, on-resistance Rdson of the FET varies according to the TCR of the FET. As temperatures vary, a sensed source-drain current level through the FET may diverge from the current level through the load of the SMPS circuit. Thus, a particular overcurrent threshold which is used to accurately determine an overcurrent event at a first temperature of the FET may no longer accurately determine the overcurrent event at another temperature.

Described herein is a circuit configured for high precision overcurrent protection that advantageously varies an overcurrent threshold level according to an adjustable temperature coefficient of the circuit as temperature of the circuit varies. The adjustable temperature coefficient of the circuit is adjusted to substantially match the temperature coefficient of resistance of a FET of the circuit. As a result, as the on-resistance of the FET varies with temperature, the overcurrent threshold will also vary proportionally. Thus, the circuit advantageously detects an overcurrent condition of the FET across a range of temperatures. Other improvements or advantages will also be described below or become apparent from the following disclosure.

Figure 1:
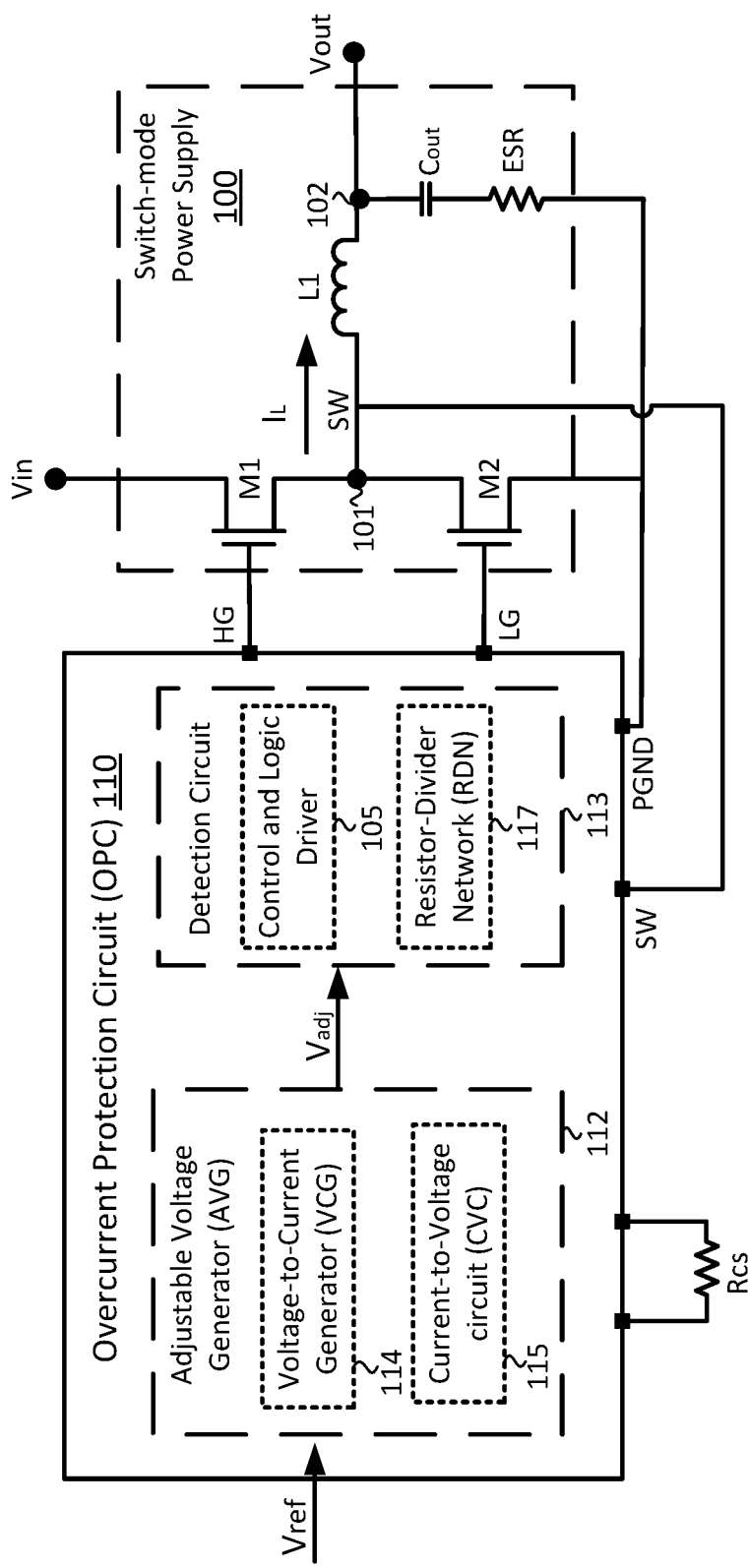
FIG. 1 is a simplified schematic of an overcurrent protection circuit in accordance with one or more example embodiments.

FIG. 1 is a simplified schematic of an overcurrent protection circuit 110, in accordance with one or more example embodiments. As shown in FIG. 1, the overcurrent protection circuit 110 is coupled to a switch M2, such as a MOSFET, having an on-resistance Rdson. The on-resistance Rdson varies with temperature based on a temperature coefficient of the switch M2. In the example embodiment of FIG. 1, the switch M2 is a low-side switch (e.g., a synchronous switch) in a switch-mode power supply (SMPS) circuit 100, such as a DC-DC buck converter. The switch M2 is coupled to and controlled by the overcurrent protection circuit 110. A high-side switch M1 and the switch M2 of the SMPS 100 provide a current $I_L$ via inductor L1 to an output node Vout. A load (not shown) is typically coupled to the output node Vout. A first terminal of an output capacitor Cout, having a resistance symbolically shown by resistor ESR, is coupled at one end to the inductor L1 and the Vout node at node 102. A second terminal of the output capacitor Cout is coupled to a voltage ground (PGND). A node 101, sometimes referred to as a phase node or switch node, is coupled to a port of the overcurrent protection circuit 110 designated as SW. The overcurrent protection circuit 110 is configured to receive, sense, or measure a voltage and/or current from the node 101.

As shown in FIG. 1, the overcurrent protection circuit 110 is coupled to a high gate node (HG) of the switch M1 and to a low gate node (LG) of the switch M2. A control logic and driver circuit 105 of the overcurrent protection circuit 110 controls the turning ON or OFF of the switches M1, M2 by applying driving signal(s) to the gate(s) of one or both of the switches M1, M2. During an overcurrent event, excess amounts of current $I_L$ flows through L1, which can saturate L1 and damage one or both of the switches M1 and/or M2.

As described below and in greater detail in conjunction with FIGS. 2-4, to protect the SMPS 100, and in particular, the switch M2, from an overcurrent condition, a level of a current or voltage which is proportional to the output current $I_L$ is compared to a threshold current level. The threshold current level can be embodied as a voltage or as a current. If the level of the current or voltage which is proportional to the output current $I_L$ exceeds the threshold current level, the overcurrent protection circuit 110 turns one or both of the switches M1, M2 OFF.

The overcurrent protection circuit 110 is configured to generate an adjustable overcurrent threshold level. As mentioned previously, the overcurrent protection circuit 110 advantageously adjusts the overcurrent threshold level with temperature according to a temperature coefficient which is the same or similar to a TCR of the switch M2. The adjustable overcurrent threshold level is determined based on an adjustable voltage level Vadj which is generated by an adjustable voltage generator circuit 112. The voltage level Vadj is generated at least in part based on (e.g., matched or proportionally to) the temperature coefficient of the switch M2, and a resistive value of a programmable scaling resistor Rcs coupled to the overcurrent protection circuit 110, as further described below in conjunction with FIG. 2.

As shown in FIG. 1, the adjustable voltage generator circuit 112 includes a voltage-to-current generator circuit 114, and a current-to-voltage circuit 115, amongst other components, which contribute to generating the voltage level Vadj. The generated voltage level Vadj is provided to the detection circuit 113 of the overcurrent protection circuit 110. As described in greater detail below in conjunction with FIG. 3, the detection circuit 113, having a resistor-divider network 117, uses the received voltage level Vadj to generate the adjustable overcurrent threshold level which is compared to a voltage or current which is proportional or otherwise representative of the current $I_L$.

Figure 2:
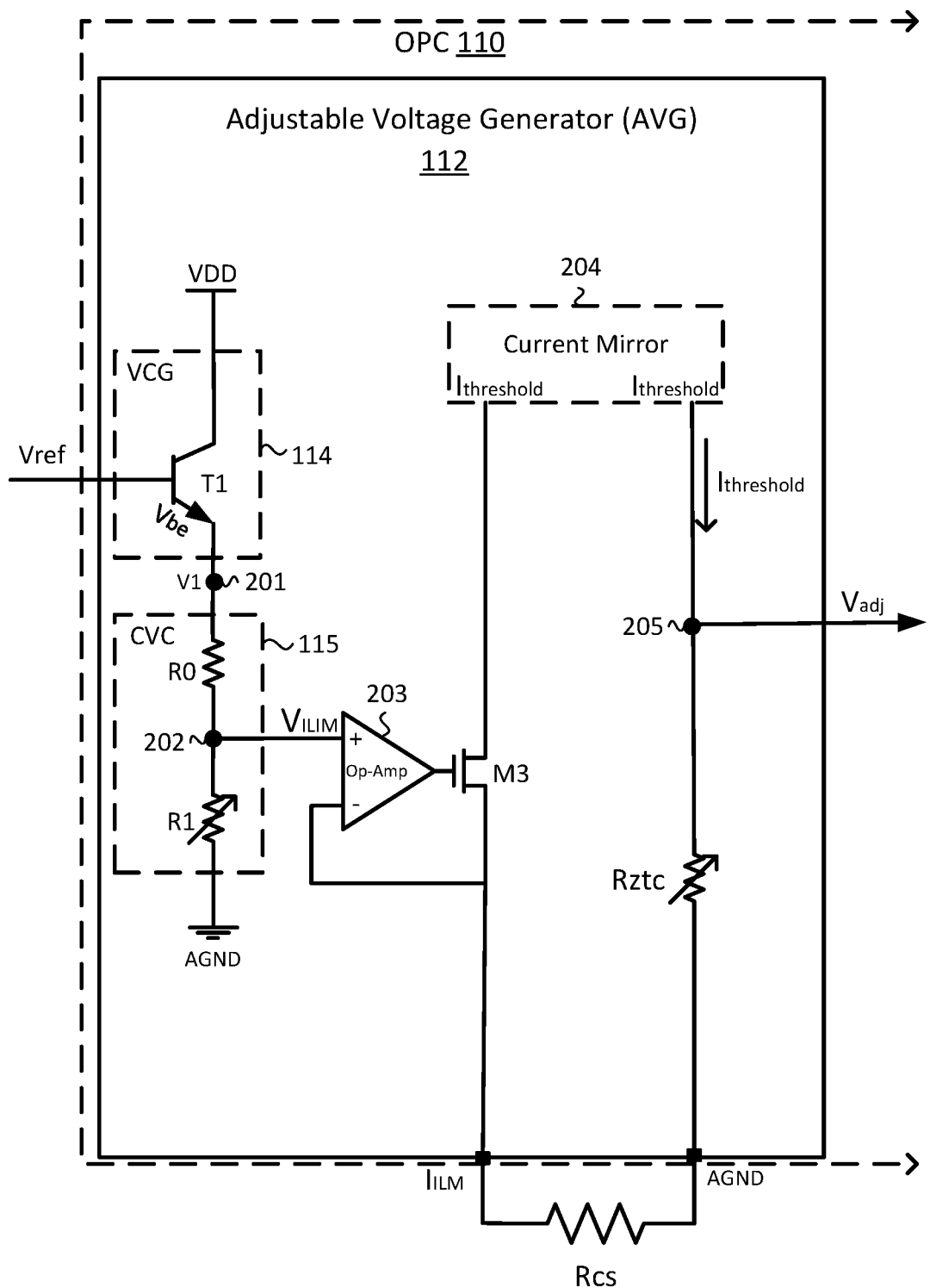
FIG. 2 illustrates details of the overcurrent protection circuit of FIG. 1, in accordance with some embodiments.

FIG. 2 illustrates details of the adjustable voltage generator circuit 112 of the overcurrent protection circuit 110 shown in FIG. 1. The adjustable voltage generator circuit 112 is configured to generate the voltage level Vadj based on (e.g., matched or proportionally to) the temperature coefficient of the switch M2. In an example embodiment, the voltage level Vadj has a positive temperature coefficient that is adjusted to substantially match the temperature coefficient of the on-resistance Rdson of the switch M2. As shown in FIG. 2, the adjustable voltage generator circuit 112 includes the voltage-to-current generator circuit 114, which includes a switch T1, such as a bipolar junction transistor (BJT) having a base, an emitter and a collector. In some embodiments, the voltage-to-current generator circuit 114 has a negative temperature coefficient (e.g., Vbe of T1 changes at a rate of approximately −2 mV/degC) and is configured to generate an output voltage V1 at node 201 based on a reference voltage Vref received at the base of T1. V1 is substantially equal to Vref minus the voltage Vbe between the base and emitter of T1. In some embodiments, Vref is pre-adjusted to substantially match the temperature coefficient of the on-resistance Rdson of the switch M2. In yet other embodiments, for a different temperature coefficient of the on-resistance Rdson of the switch M2, Vref is trimmed such that the Vref-Vbe matches the temperature coefficient of the Rdson of the switch M2.

The adjustable voltage generator circuit 112 further includes the current-to-voltage circuit 115 coupled to the voltage-to-current generator circuit 114 to receive the voltage V1 at node 201. In some embodiments, the current-to-voltage circuit 115 has a net positive temperature coefficient and is configured to generate, based on the voltage V1, an output voltage $V_{ILIM}$. In other embodiments, the voltage-to-current generator circuit 114 has a positive temperature coefficient and the current-to-voltage circuit 115 has a negative temperature coefficient.

In the example embodiment of FIG. 2, the current-to-voltage circuit 115 is implemented using a resistor-divider configuration with a resistor R0 which receives voltage V1 from node 201, and a variable resistor R1 coupled in series to resistor R0 at a common node 202. The voltage $V_{ILIM}$ is thus generated based on the following Equation 1:

$$V_{ILIM} = \frac{R1*(Vref - Vbe)}{(R1 + R0)} \qquad \text{(Equation 1)}$$

The generated voltage $V_{ILIM}$ is output from the common node 202 to a non-inverting (+) input of Op-Amp 203, which in turn drives a gate of a switch M3, such as a MOSFET. The switch M3 is coupled at a source node to both the inverting (−) input of Op-Amp 203 and to a scaling resistor Rcs. The scaling resistor Rcs is coupled to the adjustable voltage generator circuit 112 between ports $I_{ILM}$ and ground (AGND), as shown in FIG. 2. In an example embodiment, the scaling resistor Rcs is a programmable overcurrent resistor having a selected (i.e., programmed) value which is used in determining the overcurrent threshold level of the overcurrent protection circuit 110.

As also shown in FIG. 2, the adjustable voltage generator circuit 112 further includes a current mirror 204 circuit configured to output a threshold current $I_{threshold}$ based on the voltage $V_{ILIM}$ and a value of the scaling resistor Rcs. The adjustable voltage generator circuit 112 also includes a trim resistor Rztc coupled at a first terminal to the current mirror 204 via node 205, and to a ground node (AGND) at a second terminal. In an example embodiment, the trim resistor Rztc is a variable resistor having a temperature coefficient substantially equal to zero. The adjustable voltage generator circuit 112 generates the voltage level Vadj based on the threshold current $I_{threshold}$ and a value of trim resistor Rztc, and outputs the voltage level Vadj from node 205.

The voltage level Vadj varies with temperature in accordance with a positive temperature coefficient which substantially matches the temperature coefficient of the on-resistance Rdson of the switch M2 based on the following Equation 2:

$$Vadj = \frac{V_{ILIM}*Rztc}{Rcs} \qquad \text{(Equation 2)}$$

Substituting $V_{ILIM}$ from Equation 1 into Equation 2 results in the following Equation 3:

$$Vadj = \frac{R1*(Vref - Vbe)*Rztc}{(R0+R1)*Rcs} \quad \text{(Equation 3)}$$

Thus, as shown by Equations 1-3, the voltage level Vadj and its positive temperature coefficient is generated based on (a) a temperature coefficient and base voltage (e.g., Vref) of the switch T1 (which generates Vref-Vbe), (b) respective values of the resistor R0 and the variable resistor R1 (which generate voltage $V_{ILIM}$ from Vref-Vbe), (c) a value of the programmable scaling resistor Rcs, and (d) a value of variable trim resistor Rztc.

Figure 3:
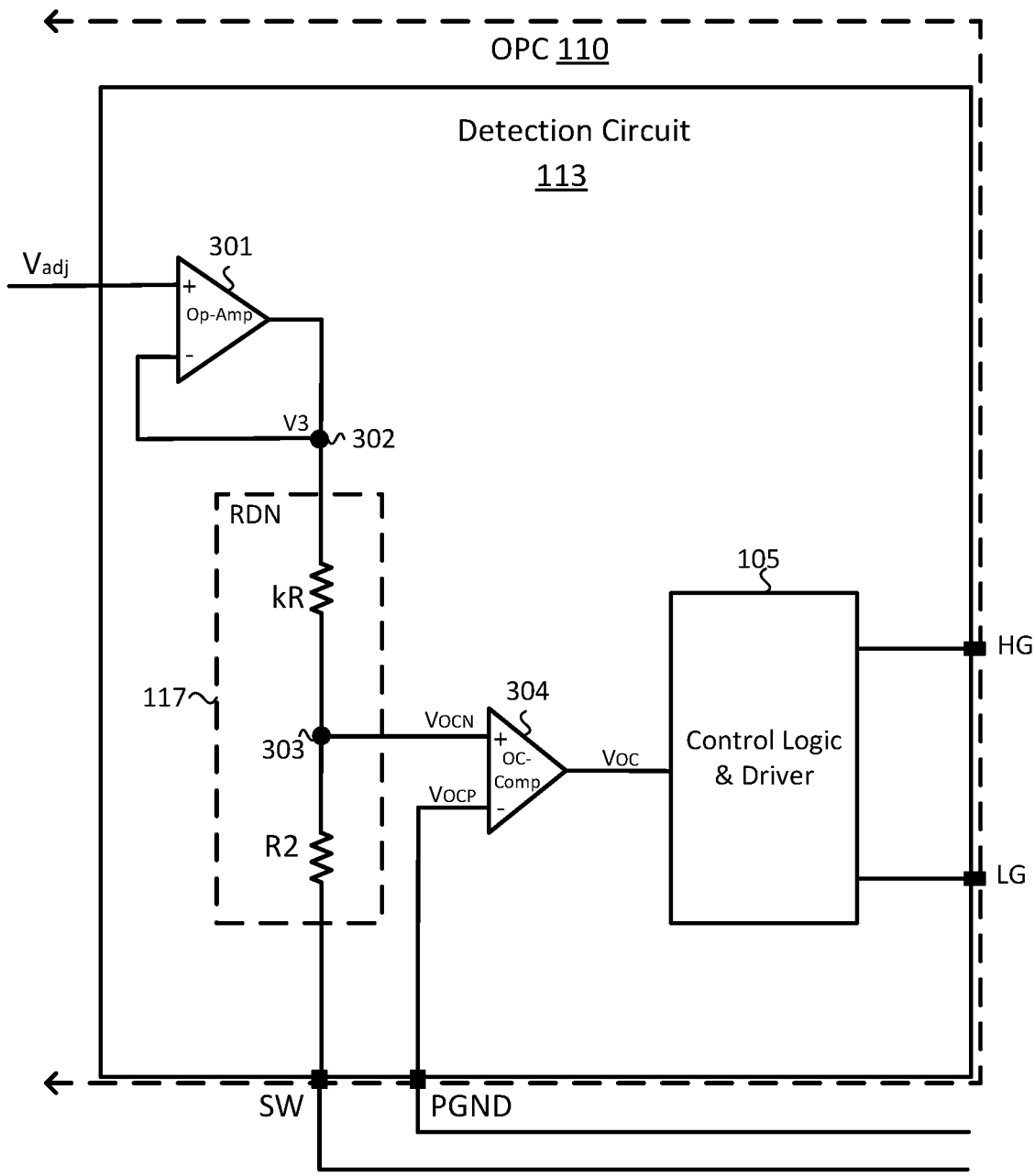
FIG. 3 illustrates further details of the overcurrent protection circuit of FIG. 1, in accordance with some embodiments.

FIG. 3 illustrates details of the detection circuit 113 of the overcurrent protection circuit 110 shown in FIG. 1. As shown in FIG. 3, the detection circuit 113 is coupled to and configured to receive the voltage level Vadj from the adjustable voltage generator circuit 112. The detection circuit 113 is also coupled to the SMPS 100 via the high gate node (HG) of the high-side switch M1 and the low gate node (LG) of the low-side switch M2. During an overcurrent event, an overcurrent event detection signal Voc is received at the control logic and driver circuit 105 of the detection circuit 113. Upon receiving the overcurrent event detection signal Voc, the control logic and driver circuit 105 reacts by turning one or both of the switches M1, M2 off to end the overcurrent event. The overcurrent event detection signal is based on a scaled level of the received voltage level Vadj, a voltage at the phase node 101, and a reference voltage (e.g., ground).

As shown in FIG. 3, the voltage level Vadj generated by the adjustable voltage generator circuit 112, is received in a non-inverting (+) input of operational amplifier Op-Amp 301 of the detection circuit 113. Based on the received voltage level Vadj, the Op-Amp 301 is configured to generate a voltage V3 at node 302. In an example embodiment, the voltage V3 is substantially equal to the voltage level Vadj.

Node 302 is coupled to an input of the resistor-divider network 117. In an example embodiment, the resistor-divider network 117 includes series-connected resistors kR and R2 coupled at a common node 303. The resistor-divider network 117 is configured to receive the generated voltage V3 at a first terminal and a voltage/current of the phase node 101 at a second terminal. Based on the received voltage V3 and the voltage/current of the phase node 101, the resistor-divider network 117 generates a voltage $V_{OCN}$ which is provided to a non-inverting (+) input of Overcurrent (OC) Comparator 304. The OC Comparator 304 compares the voltage $V_{OCN}$ to a reference voltage (e.g., ground, or another bias voltage) coupled to the inverting (−) input of the OC Comparator 304 and outputs an overcurrent event detection signal $V_{OC}$. The overcurrent event detection signal Voc is then provided to the control logic and driver circuit 105. Thus, the adjustment to overcurrent threshold level is advantageously made such that the overcurrent threshold level varies in substantially the same way that Rdson varies across a range of temperatures.

In some embodiments, a high output state of the OC Comparator 304 indicates an overcurrent event, and a low output state of the OC Comparator 304 indicates the absence of an overcurrent event. In some embodiments, while the output state of the OC Comparator 304 is low, the control logic and driver circuit 105 cycles the switch M2 between ON and OFF states. At the moment when $V_{OCN}=V_{OCP}$ the output state of the OC Comparator 304 is high. In some embodiments, upon receiving a high output state from the OC Comparator 304, the control logic and driver circuit 105 turns one or both of the switches M1, M2 OFF. When $V_{OCN}=V_{OCP}$:

$$Vsw = \frac{V3}{k} \quad \text{(Equation 4)}$$

$$Vsw = Ioc*Rdson. \quad \text{(Equation 5)}$$

where $I_{OC}$ is the overcurrent threshold level of the overcurrent protection circuit 110.

As previously stated, V3 is equal, or substantially equal, to the voltage level Vadj determined in Equation 3 above. Substituting the voltage level Vadj for V3 in Equation 5 leads to the following Equation 6:

$$Ioc = \frac{Vsw}{Rdson} = \frac{V3}{k*Rdson} = \frac{(Vref - Vbe)}{Rdson} * \frac{R1*Rztc}{k*R0*Rcs} \quad \text{(Equation 6)}$$

The voltage Vref can be trimmed to make Vref-Vbe match the temperature coefficient of the on-resistance Rdson of the switch M2. Thus, the overcurrent threshold $I_{OC}$ changes proportionally to a current through M2 as the temperature changes in the SMPS 100. A trim resistor Rztc is utilized in some embodiments to trim or otherwise compensate for process variations which may occur during manufacturing of the overcurrent protection circuit 110. In some embodiments, the trim resistor Rztc is a resistor circuit having a TCR substantially equal to zero. An advantage of the above approach is that the $I_{OC}$ will have little or no temperature dependency and therefore its value can be more accurately determined.

Figure 4:
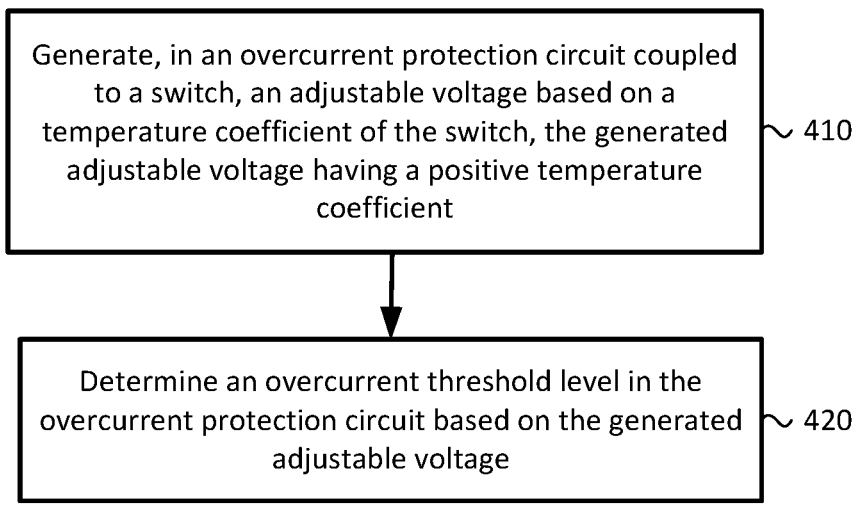
FIG. 4 is an example operation of the overcurrent protection circuit of FIG. 1, in accordance with some embodiments.

FIG. 4 illustrates an example operation of the overcurrent protection circuit 110. The process begins at Block 410 in which an adjustable voltage level Vadj is generated based on a temperature coefficient of the switch M2, with the generated voltage level Vadj having a net positive temperature coefficient. Next, at Block 420, an overcurrent threshold level is determined by the overcurrent protection circuit 110 based on the generated voltage level Vadj. Operations in Blocks 410 and 420 are performed in a manner consistent with those described above in detail in conjunction with FIGS. 1-3.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. An apparatus, comprising:
an adjustable voltage generator circuit coupled to a switch of a switch-mode power supply circuit to generate an adjustable voltage based on a temperature coefficient of the switch;
an overcurrent protection circuit to determine an adjustable overcurrent threshold level in the overcurrent protection circuit based on the adjustable voltage; and
a detection circuit of the overcurrent protection circuit to adjust a current supplied to the switch-mode power supply circuit based on (a) the adjustable voltage, and (b) a voltage from a node of the switch.

2. The apparatus of claim 1, wherein:
the switch is a low-side switch of the switch-mode power supply circuit.

3. The apparatus of claim 2, wherein:
the node of the switch is a drain node.

4. The apparatus of claim 1, wherein:
the adjustable voltage is generated in accordance with a positive temperature coefficient.

5. The apparatus of claim 1, wherein:
the switch is coupled to and controlled by the overcurrent protection circuit.

6. The apparatus of claim 5, wherein:
the overcurrent protection circuit is further operable to adjust the current supplied to the switch-mode power supply circuit independently of temperature changes in the switch-mode power supply circuit.

7. The apparatus of claim 1, wherein:
the adjustable voltage is generated in accordance with an adjustable temperature coefficient; and
the overcurrent protection circuit is further operable to adjust the adjustable temperature coefficient to substantially match the temperature coefficient of the switch.

8. The apparatus of claim 1, further comprising:
a programmable scaling resistor coupled to the overcurrent protection circuit; and
the overcurrent protection circuit is operable to determine a voltage level of the adjustable voltage based on a value of the programmable scaling resistor.

9. The apparatus of claim 1, further comprising:
a voltage-to-current generator circuit of the adjustable voltage generator circuit to generate a first voltage based on a received reference voltage; and
a current-to-voltage circuit coupled to the voltage-to-current generator circuit to generate a second voltage based on the first voltage, the second voltage having a net positive temperature coefficient.

10. The apparatus of claim 9, wherein:
the voltage-to-current generator circuit has a negative temperature coefficient; and
the current-to-voltage circuit has a positive temperature coefficient.

11. The apparatus of claim 9, further comprising:
a bipolar junction transistor (BJT) of the voltage-to-current generator circuit having a base, an emitter and a collector, the received reference voltage being received at the base of the BJT.

12. The apparatus of claim 9, wherein:
the received reference voltage substantially matches the temperature coefficient of the switch.

13. The apparatus of claim 9, further comprising:
a first resistor of the current-to-voltage circuit coupled to the voltage-to-current generator circuit to receive the first voltage; and
a variable resistor coupled in series to the first resistor via a common node, the second voltage being output from the common node.

14. The apparatus of claim 9, further comprising:
a scaling resistor coupled to the overcurrent protection circuit; and
a current mirror circuit of the adjustable voltage generator circuit to output a threshold current based on (a) the second voltage, and (b) a value of the scaling resistor.

15. The apparatus of claim 14, further comprising:
a trim resistor coupled to the current mirror circuit to generate the adjustable voltage based on the threshold current and the trim resistor.

16. The apparatus of claim 15, wherein the trim resistor has a temperature coefficient substantially equal to zero.

17. The apparatus of claim 15, wherein the trim resistor is a variable resistor.

18. The apparatus of claim 1, further comprising:
an operational amplifier of the detection circuit to generate a second voltage based on the adjustable voltage received from the adjustable voltage generator circuit; and
a resistor-divider network of the detection circuit to receive i) the second voltage and, ii) the voltage from the node of the switch;
wherein the adjustable overcurrent threshold level is based on an output voltage of the resistor-divider network.

19. The apparatus of claim 18, wherein the second voltage is substantially equal to the adjustable voltage.

* * * * *